US008050087B2

(12) United States Patent
Park et al.

(10) Patent No.: US 8,050,087 B2
(45) Date of Patent: Nov. 1, 2011

(54) NON-VOLATILE MEMORY DEVICE INCLUDING BLOCK STATE CONFIRMATION CELL AND METHOD OF OPERATING THE SAME

(75) Inventors: Ju-hee Park, Guri-si (KR); Jae-woong Hyun, Uijeongbu-si (KR); Kyoung-lae Cho, Yongin-si (KR); Yoon-dong Park, Yongin-si (KR); Seung-hoon Lee, Seoul (KR); Kee-won Kwon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 470 days.

(21) Appl. No.: 12/071,349

(22) Filed: Feb. 20, 2008

(65) Prior Publication Data

US 2008/0316824 A1 Dec. 25, 2008

(30) Foreign Application Priority Data

Jun. 22, 2007 (KR) ........................ 10-2007-0061874

(51) Int. Cl.
*G11C 11/34* (2006.01)
*G11C 16/04* (2006.01)

(52) U.S. Cl. .............................. 365/185.03; 365/233.19

(58) Field of Classification Search ............. 365/185.03, 365/185.17, 185.22, 233.19
See application file for complete search history.

(56) References Cited

U.S. PATENT DOCUMENTS

| | | | | |
|---|---|---|---|---|
| 6,297,988 B1 * | 10/2001 | Parker et al. | ............. | 365/185.03 |
| 6,535,419 B2 * | 3/2003 | Parker et al. | ............. | 365/185.03 |
| 7,433,246 B2 * | 10/2008 | Lee | ......................... | 365/189.14 |
| 7,586,789 B2 * | 9/2009 | Hsieh et al. | ............. | 365/185.22 |
| 2006/0069851 A1 * | 3/2006 | Chung et al. | .................. | 711/103 |

* cited by examiner

*Primary Examiner* — VanThu Nguyen
(74) *Attorney, Agent, or Firm* — Harness, Dickey & Pierce, PLC

(57) ABSTRACT

Provided are a semiconductor device having a block state confirmation cell that may store information indicating the number of data bits written to a plurality of memory cells, a method of reading memory data based on the number of the data bits written, and/or a memory programming method of storing the information indicating the number of the data bits written. The semiconductor device may include one or more memory blocks and a controller. Each of the memory blocks may include a plurality of memory cells each storing data, and a block state confirmation cell storing information indicating the number of data bits written to the memory cells. The controller may read the data bits from the memory blocks based on the number of data bits, which is indicated in the information in the block state confirmation cell.

20 Claims, 4 Drawing Sheets

| CHECK BIT 1 | CHECK BIT 2 | CHECK BIT 3 | CHECK BIT (n-1) | PROGRAMMED STATE | | | | | TOTAL NUMBER OF BITS OF DATA THAT ARE WRITTEN |
|---|---|---|---|---|---|---|---|---|---|
| off | off | off | off | MSB n | LSB 4 | LSB 3 | LSB 2 | <u>LSB 1</u> | 1(SLC) |
| on | off | off | off | MSB n | LSB 4 | LSB 3 | <u>LSB 2</u> | <u>LSB 1</u> | 2 |
| on | on | off | off | MSB n | LSB 4 | <u>LSB 3</u> | <u>LSB 2</u> | <u>LSB 1</u> | 3 |
| on | on | on | off | MSB n | <u>LSB 4</u> | <u>LSB 3</u> | <u>LSB 2</u> | <u>LSB 1</u> | 4 |
| ⋮ | ⋮ | ⋮ | ⋮ | ⋮ | | | | | ⋮ |
| on | on | on | on | <u>MSB n</u> | <u>LSB 4</u> | <u>LSB 3</u> | <u>LSB 2</u> | <u>LSB 1</u> | n |

NON-VOLATILE MEMORY DEVICE INCLUDING BLOCK STATE CONFIRMATION CELL AND METHOD OF OPERATING THE SAME

PRIORITY DOCUMENT

This application claims the benefit of Korean Patent Application No. 10-2007-0061874, filed on Jun. 22, 2007, in the Korean Intellectual Property Office, the disclosure of which is incorporated herein in its entirety by reference.

BACKGROUND

Non-volatile memory devices that may be electrically erased and programmed may retain data even if a supplied power is discontinued. A representative example of non-volatile memory devices is flash memory.

Memory cells that constitute flash memory may include a cell transistor having a control gate, a floating gate, a source and a drain. A cell transistor of a flash memory may be programmed or erased according to the Fowler-Nordheim (F-N) tunneling mechanism.

Data in a cell transistor may be erased by applying a ground voltage to a control gate of the cell transistor and applying a voltage higher than a power supply voltage to a semiconductor substrate (or bulk). Under such erasing bias conditions, a strong electric field may be formed between a floating gate and the semiconductor bulk due to a large voltage difference therebetween. Thus, electrons present in the floating gate may be discharged to the semiconductor bulk according to the F-N tunneling mechanism. In this case, the threshold voltage of the erased cell transistor may decrease.

The cell transistor may be programmed by applying a voltage higher than the power supply voltage to the control gate and applying a ground voltage to a drain and the semiconductor bulk. Under such bias conditions, electrons may be injected into the floating gate of the cell transistor according to the F-N tunneling mechanism. In this case, the threshold voltage of the programmed cell transistor may increase. A state in which electrons are injected into the floating gate may be referred to as a "programming state," and a state in which electrons do not exist in the floating gate may be referred to as an "erased state." A threshold voltage in the programming state may be greater than zero and a threshold voltage in the erased state may be less than zero.

Recently, research has been conducted into development of a multi-level flash memory capable of storing two or more data bits in one memory cell in order to improve the degree of intensity of flash memory. A memory cell that may store multiple data bits may be referred to as a multi-level cell (MLC), and a memory cell that may store a single data bit may be referred to as a single-level cell (SLC).

The MLC may have four or more threshold voltage distributions, and four or more data storing states corresponding to the distributions in order to store two or more data bits. However, as more data bits are stored in the MLC, more threshold voltage distributions may be needed by the MLC, thereby increasing a time required to read the data from the MLC.

SUMMARY

Example embodiments may provide a semiconductor device having a block state confirmation cell storing information indicating the number of data bits written to a plurality of memory cells.

Example embodiments may also provide a method of storing information indicating the number of data bits written to a plurality of memory cells and/or reading the data from the memory cells based on the information.

Example embodiments may also provide a memory data programming method of storing information indicating the number of data bits written to a plurality of memory cells.

According to example embodiments, there may be provided a semiconductor device including one or more memory blocks each including a block state confirmation cell and one or more memory cells, the block state confirmation cell to store information indicating a number of data bits written to the one or more memory cells, and/or a controller reading only stored data bits from the respective one or more memory blocks, based on the information stored in the block state confirmation cells.

A number of bits that is to be stored in each of the block state confirmation cells may be one bit less than the number of data bits that is to be stored in the memory cells of each respective memory block to which each block state confirmation cell corresponds.

According to example embodiments, there may be provided a memory data reading method of reading data from one or more memory cells including detecting a number of data bits written to the one or more memory cells and/or reading only the detected data bits from the one or more memory cells.

According to example embodiments, there may be provided a memory programming method including writing the data to a plurality of memory cells, storing information indicating a number of data bits written to the plurality of memory cells, and/or verifying only the written data bits, which are indicated in the stored information.

BRIEF DESCRIPTION

The above and other features and advantages of will become more apparent by describing in detail example embodiments thereof with reference to the attached drawings in which.

DETAILED DESCRIPTION

Figure 1:
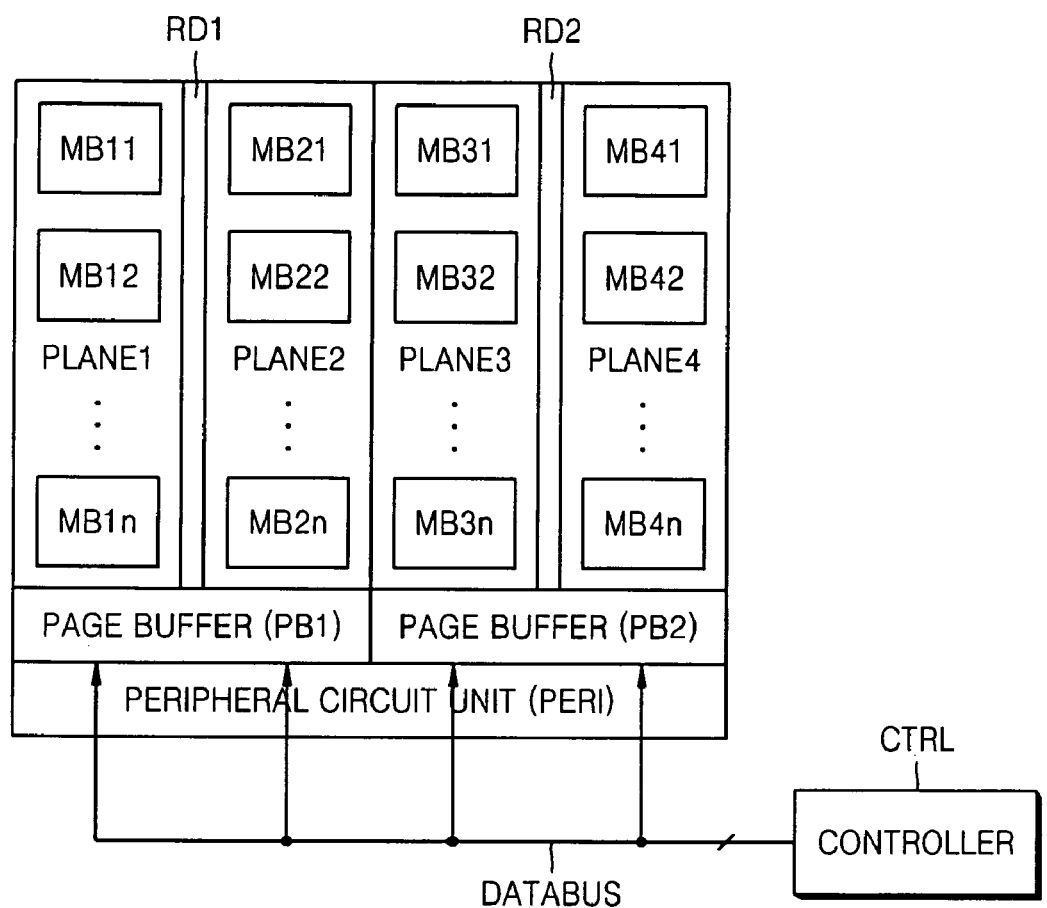
FIG. 1 is a block diagram of a semiconductor device with a plurality of memory blocks, according to example embodiments.

Example embodiments will be described in detail with reference to the accompanying drawings. Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a block diagram of a semiconductor device with a plurality of memory blocks MB11 through MB4$n$, according to example embodiments. The semiconductor device of FIG. 1 may be divided into a plurality of planes PLANE1 through PLANE4, each having n memory blocks, e.g., memory blocks MB11 through MB1$n$. Although FIG. 1 may illustrate that the semiconductor device includes the four planes PLANE1 through PLANE4, it would be apparent to those of ordinary skill in the art that the number of planes is not limited to four and therefore may vary.

Row decoders RD1 and RD2 may be located between the planes PLANE1 through PLANE4. However, it would be apparent to those of ordinary skill in the art that the row decoders RD1 and RD2 can be located in various other locations other than between the planes PLANE1 through PLANE4. For example, the row decoder RD1 may not be located between the planes PLANE1 and PLANE2, but instead, may be located to the left side of the plane PLANE1.

The semiconductor device of FIG. 1 may further include a plurality of page buffers PB1 and PB2. The page buffers PB1 and PB2 may either receive write data from outside and then transmit it to the memory blocks MB11 through MB4$n$, or receive read data from the memory blocks MB11 through MB4$n$ and transmit it to the outside. The semiconductor device of FIG. 1 may include a controller CTRL. The controller CTRL may control a write operation and a read operation to be performed on the memory blocks MB11 through MB4$n$.

Figure 2:
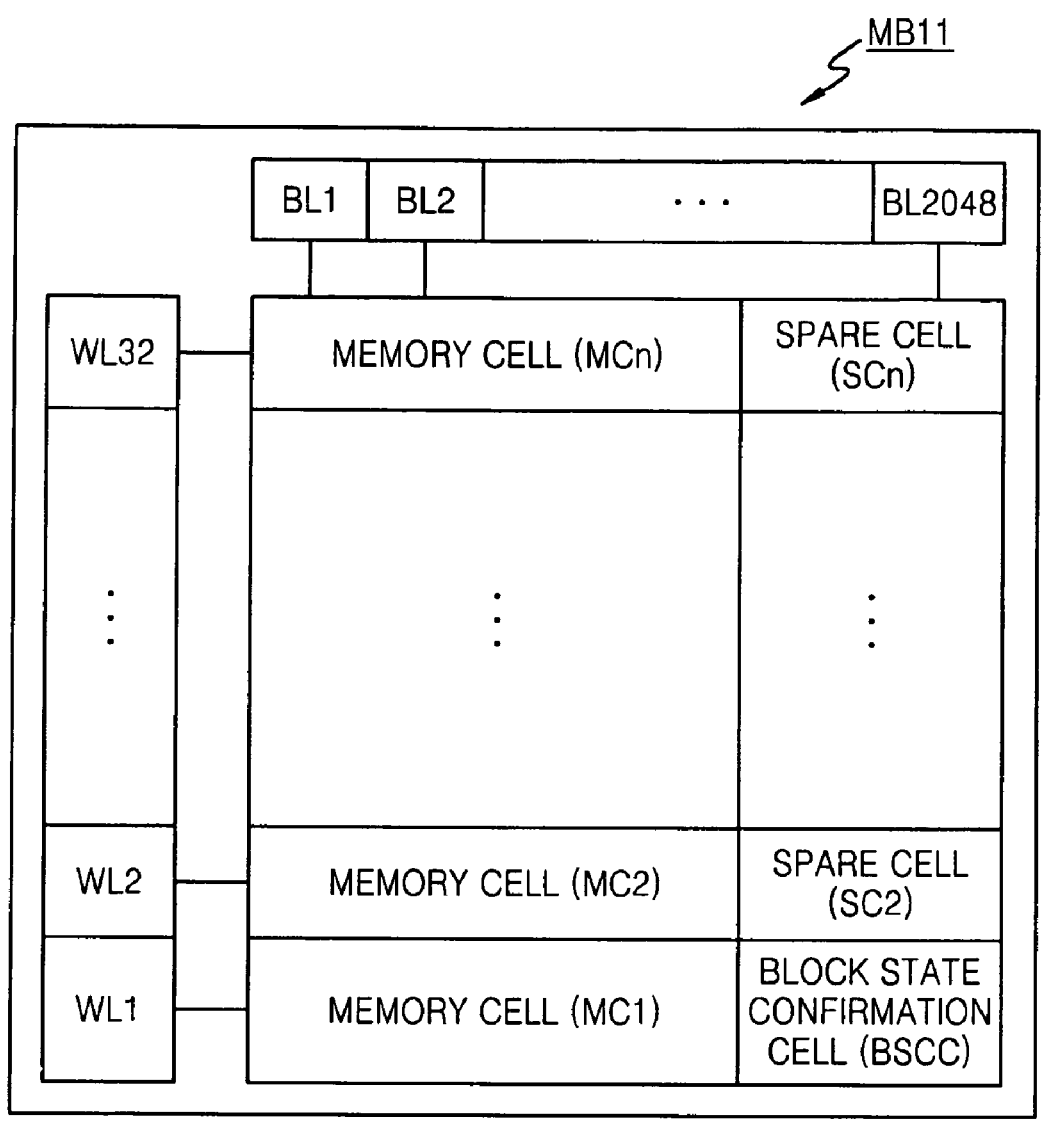
FIG. 2 is a block diagram illustrating in more detail one of the memory blocks illustrated in FIG. 1, which has a block state confirmation cell, according to example embodiments.

FIG. 2 is a block diagram illustrating in detail the memory block MB11 from among the memory blocks illustrated in FIG. 1, which has a block state confirmation cell BSCC. Referring to FIG. 2, the memory block MB11 may include a plurality of memory cells MC1 through MC$n$ and a block state confirmation cell BSCC. Each of the memory cells MC1 through MC$n$ may store data. The block state confirmation cell BSCC may store information indicating the number of data bits written to each of the memory cells MC1 through MC$n$. The information may indicate the number of bits, in which the data has been written among the bits of the memory cell. FIG. 2 illustrates the memory block MB11 from among the memory blocks MC1 through MC$n$ illustrated in FIG. 1 but all or some of the other memory blocks MC2 through MC$n$ may have the same construction as the memory block MB11 illustrated in FIG. 2.

The controller CTRL illustrated in FIG. 1 may read the data from the memory block MB11 through MB4$n$ based on the number of the bits indicated in the information stored in the block state confirmation cell BSCC. More specifically, the controller CTRL may read the information from the block state confirmation cell BSCC in order to determine the number of data bits written to the memory cells MC1 through MC$n$. Thus, according to example embodiments, a semiconductor device may not need to perform a read operation on all the data bits written to the memory cells MC1 through MC$n$ but may instead perform the read operation on only the data bits written to the memory cells MC1 through MC$n$. Accordingly, it may be possible to increase the speed of performing the read operation of the semiconductor device.

The block state confirmation cell BSCC, according to example embodiments, may be available for a read operation performed in order to verify data written to memory cells. More specifically, for data verification, a semiconductor device, according to example embodiments, may use the number of bits indicated in information stored in the block state confirmation cell BSCC. That is, the data written to the memory cells MC1 through MC$n$ may be verified based on the number of the bits indicated in the information stored in the block state confirmation cell BSCC. For example, a first data bit may be written to the memory cells MC1 through MC$n$, and then information indicating that the first data bit has been written may be stored in the block state confirmation cell BSCC. Then, the first data bit written to the memory cells MC1 through MC$n$ may be verified, based on the information that is stored in the block state confirmation cell BSCC and may indicate that the first data bit has been written. Next, a second data bit may be written to the memory cells MC1 through MC$n$, and then information indicating that the second data bit has been written may be stored in the block state confirmation cell BSCC. Then, the second data bit written to the memory cells MC1 through MC$n$ may be verified. That is, only the first data bit may be verified without verifying the second data bit during the verification of the already written first data bit, and only the second data bit may be verified without verifying the other data bits following the second data bit thereof during the verification of the already written second data bit.

Also, the block state confirmation cell BSCC, according to example embodiments, may be available for a general read operation performed in order to read data written to memory cells.

A number of bits that may be stored in the block state confirmation cell BSCC may be one bit less than the number of data bits stored in the memory cells MC1 through MCn of the memory block MB11, to which the block state confirmation cell BSCC belongs. For example, assuming that n data bits may be stored in the memory cell MC1, n−1 data bits may be stored in the block state confirmation cell BSCC.

Figure 3:
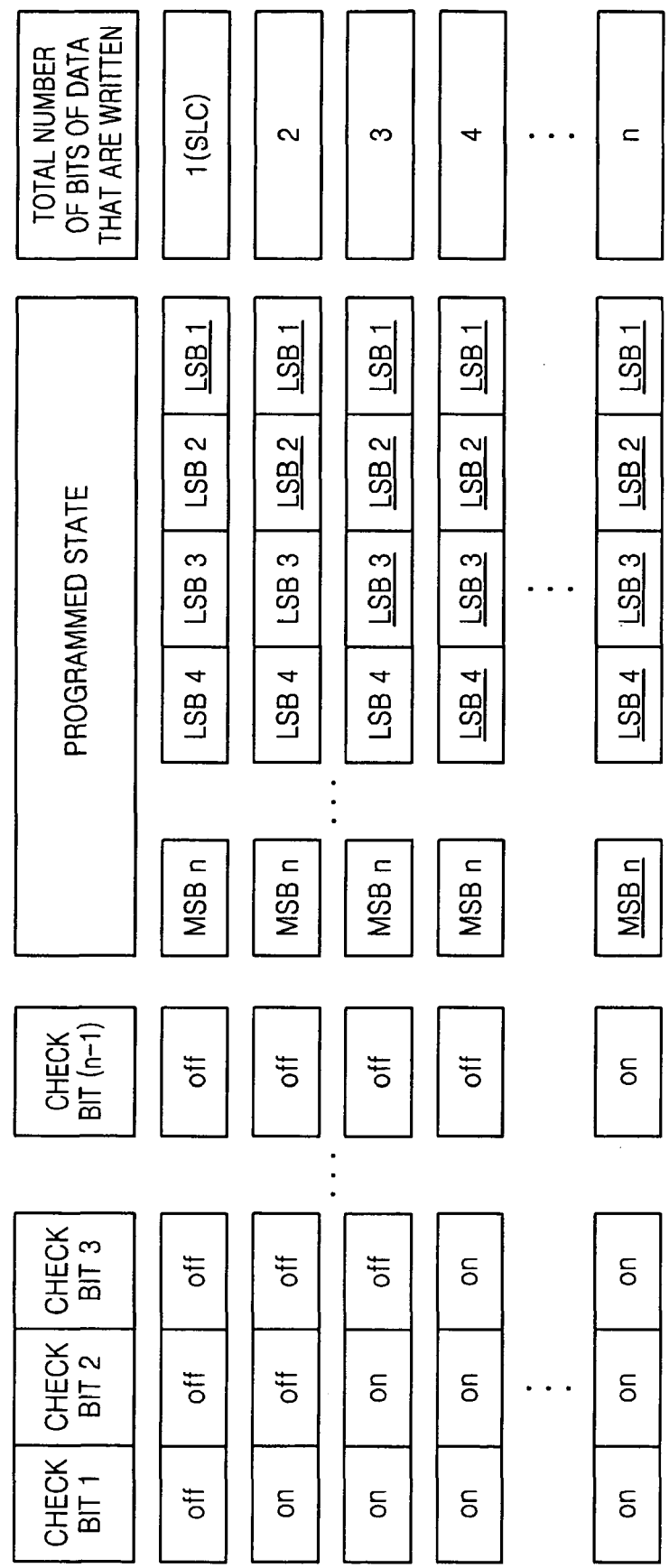
FIG. 3 is a diagram illustrating a method of determining the number of data bits written to a memory cell, based on information stored in the block state confirmation cell illustrated in FIG. 2, according to example embodiments.

FIG. 3 is a diagram illustrating a method of determining the number of data bits written to memory cells based on information stored in the block state confirmation cell BSCC illustrated in FIG. 2, according to example embodiments.

As illustrated in FIG. 3, if all bits checkbit1 through checkbit(n−1) of the block state confirmation cell BSCC are "off," it may be determined that only a single data bit has been written to the memory cells MC1 through MCn illustrated in FIG. 2. Thus, only the 1 data bit may be read from the memory cells MC1 through MCn. Also, as illustrated in FIG. 3, if only the first bit Checkbit1 of the block state confirmation cell BSCC is "on" and the other bits checkbit1 through checkbit (n−1) are "off," it may be determined that 2 data bits have been written to the memory cells MC1 through MCn. Thus, the 2 data bits may be read from the memory cells MC1 through MCn. In example embodiments, that a bit of the block state confirmation cell BSCC is "on" may infer that the bit is programmed to "0," and that a bit of the block state confirmation cell BSCC is "off" may infer that the bit is programmed to "1."

Also, if first and second bits Checkbit1 and Checkbit2 of the block state confirmation cell BSCC are "on" and the other bits are "off," it may be determined that 3 data bits have been written to the memory cells MC1 through MCn. Thus, the 3 data bits may be read from the memory cells MC1 through MCn. If all bits of the block state confirmation cell BSCC are "on," it may be determined that n data bits have been written to the memory cells MC1 through MCn. Thus, the n data bits may be read from the memory cells MC1 through MCn.

Referring to FIG. 2, the block state confirmation cell BSCC may belong to a first data page of the corresponding memory block MB11. The block state confirmation cell BSCC may be connected to a first word line WL1 from among a plurality of word lines connected to the corresponding memory block MB11. Alternatively, the block state confirmation cell BSCC may belong to a data page other than the first data page, and may be connected to word lines other than the world line WL1, such as WL2 through WL32.

The memory block MB11 may further include one or more spare cells SC2 through SCn that can replace defective cells from among the memory cells MC1 through MCn. The total number of the spare cells SC2 through SCn and the block state confirmation cells BSCC in a row may be equal to the total number of the memory cells MC1 through MCn in the row. That is, one of the spare cells according to example embodiments, may be used as the block state confirmation cell BSCC.

Figure 4:
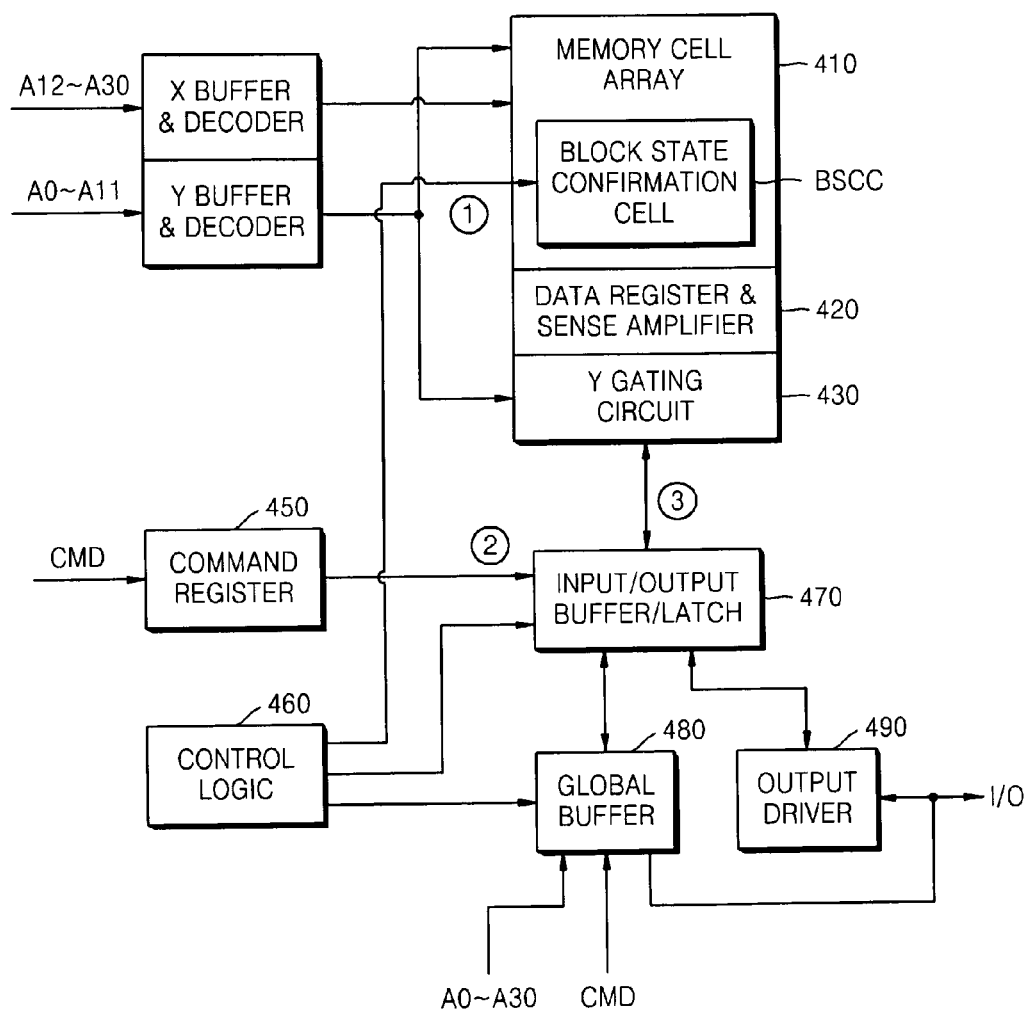
FIG. 4 is a block diagram of a semiconductor device with the block state confirmation cell illustrated in FIG. 2, according to example embodiments.

FIG. 4 is a block diagram of a semiconductor device having the block state confirmation cell BSCC illustrated in FIG. 2, according to example embodiments. Referring to FIG. 4, a control logic 460 may read information stored in the block state confirmation cell BSCC of a memory cell array 410 in order to determine a current writing state of the memory cell array. That is, the control logic 460 may determine a number of data bits written to each of memory cells. Then, a command register 450 may select a reading manner based on the determination result. That is, the command register 450 may determine the number of data bits to be read from the memory cell. Then, the data may be read from the memory cell array 410 by using the control logic 460, an input/output buffer/latch 470, a Y gating circuit 430, a data register/sense amplifier 420, an output driver 490, and/or a global buffer 480.

As described above, in a semiconductor device, a method of reading data from a memory and a memory programming method according to example embodiments may be performed, wherein a read operation is performed on only data bits written to a memory cell, rather than on all the bits of the memory cell, thereby increasing the speed of performing the read operation.

While example embodiments have been particularly shown and described with reference to example embodiments thereof, it will be understood by those of ordinary skill in the art that various changes in form and details may be made therein without departing from the spirit and scope of example embodiments as defined by the following claims.

What is claimed is:

1. A semiconductor device comprising:
one or more memory blocks each including a block state confirmation cell and one or more memory cells, the block state confirmation cell to store information indicating a number of data bits written to each of the one or more memory cells of the corresponding memory block; and
a controller reading only the stored data bits from the one or more memory blocks, based on the information stored in the block state confirmation cells.

2. The semiconductor device of claim 1, wherein a number of bits stored in each of the block state confirmation cells is one bit less than a number of data bits stored in the memory cells of each of the corresponding memory blocks.

3. The semiconductor device of claim 1, wherein each of the block state confirmation cells belongs to a first data page of the corresponding memory block.

4. The semiconductor device of claim 1, wherein each of the block state confirmation cells is connected to a first word line from among a plurality of word lines connected to the corresponding memory block.

5. The semiconductor device of claim 1, wherein each of the one or more memory blocks further includes at least one spare cell that replaces a defective memory cell from among the one or more memory cells, and
a total number of spare cells and block state confirmation cells in a row is equal to a total number of the memory cells in the row.

6. The semiconductor device of claim 1, wherein the controller verifies the data bits written to the one or more memory cells, based on the information stored in the corresponding block state confirmation cell.

7. The semiconductor device of claim 1, wherein the one or more memory cells include NAND flash memory cells.

8. A memory reading method of reading data from one or more memory cells, the method comprising:
detecting a number of data bits written to each of one or more memory cells; and
reading only the detected data bits from the one or more memory cells.

9. The method of claim 8, wherein the detecting of the number of data bits written includes detecting the number of bits indicated by a block state confirmation cell.

10. The method of claim 9, wherein the number of bits indicated in the block state confirmation cell is one bit less than a number of data bits stored in one of the one or more memory cells.

11. The method of claim 10, wherein at least one memory block includes the one or more memory cells and the block state confirmation cell.

12. The method of claim 8, wherein the one or more memory cells include multi-level flash memory cells capable of storing M data bits.

13. The method of claim 8, wherein the read data bits are used to verify the data written to the one or more memory cells, and the verification is performed on only the data bits written to the memory cells based on the detected number of data bits.

14. The method of claim 13, wherein the verification includes a controller reading information stored in the block state confirmation cell.

15. A memory programming method comprising:

writing data to each of a plurality of memory cells;

storing information indicating a number of data bits written to each of the plurality of memory cells; and verifying only the written data bits, which are indicated by the stored information.

16. The method of claim 15, wherein the storing information indicating a number of data bits written includes storing a number of bits to a block state confirmation cell.

17. The method of claim 15, wherein the plurality of memory cells include multi-level flash memory cells capable of storing M data bits.

18. The method of claim 16, wherein during the storing of the information, a number of bits of the stored information is one bit less than a number of data bits stored in each of the plurality of memory cells.

19. The method of claim 18, wherein at least one memory block includes the plurality of memory cells and the block state confirmation cell.

20. The method of claim 18, wherein the verifying includes a controller verifying the data bits written to the one or more memory cells, based on the information stored in the corresponding block state confirmation cell.

* * * * *

UNITED STATES PATENT AND TRADEMARK OFFICE
CERTIFICATE OF CORRECTION

| | | |
|---|---|---|
| PATENT NO. | : 8,050,087 B2 | Page 1 of 1 |
| APPLICATION NO. | : 12/071349 | |
| DATED | : November 1, 2011 | |
| INVENTOR(S) | : Park et al. | |

It is certified that error appears in the above-identified patent and that said Letters Patent is hereby corrected as shown below:

In the claims, claim 1 should read:

1. A semiconductor device comprising:

one or more memory blocks each including a block state confirmation cell and one or more memory cells, the block state confirmation cell to store information indicating a number of data bits written to each of the one or more memory cells of the corresponding memory block; and a controller reading only the stored data bits from the one or more memory blocks, based on the information stored in the block state confirmation cell.

Signed and Sealed this
Tenth Day of January, 2012

David J. Kappos
*Director of the United States Patent and Trademark Office*

UNITED STATES PATENT AND TRADEMARK OFFICE
CERTIFICATE OF CORRECTION

PATENT NO. : 8,050,087 B2  
APPLICATION NO. : 12/071349  
DATED : November 1, 2011  
INVENTOR(S) : Park et al.

Page 1 of 1

It is certified that error appears in the above-identified patent and that said Letters Patent is hereby corrected as shown below:

In the claims, Column 6, lines 15-24, claim 1, should read:

1. A semiconductor device comprising:

one or more memory blocks each including a block state confirmation cell and one or more memory cells, the block state confirmation cell to store information indicating a number of data bits written to each of the one or more memory cells of the corresponding memory block; and a controller reading only the stored data bits from the one or more memory blocks, based on the information stored in the block state confirmation cell.

This certificate supersedes the Certificate of Correction issued January 10, 2012.

Signed and Sealed this
Fourteenth Day of February, 2012

David J. Kappos
*Director of the United States Patent and Trademark Office*